United States Patent
Chen et al.

(10) Patent No.: US 6,639,035 B1
(45) Date of Patent: Oct. 28, 2003

(54) POLYMER FOR CHEMICAL AMPLIFIED PHOTORESIST COMPOSITIONS

(75) Inventors: Chi-Sheng Chen, Sanchung (TW); Yen-Cheng Li, Sanchung (TW); Meng-Hsum Cheng, Chung-Li (TW)

(73) Assignee: Everlight USA, Inc., Pineville, NC (US)

( * ) Notice: Subject to any disclaimer, the term of this patent is extended or adjusted under 35 U.S.C. 154(b) by 0 days.

(21) Appl. No.: 10/154,799

(22) Filed: May 28, 2002

(51) Int. Cl.$^7$ .............................................. C08F 124/00
(52) U.S. Cl. ....................... 526/266; 526/271; 526/280; 526/281; 526/284; 526/317.1; 526/319; 526/320; 430/270.1
(58) Field of Search ................. 526/266, 271, 526/280, 281, 284, 379, 317.1, 320; 430/270.1

(56) References Cited

U.S. PATENT DOCUMENTS

| | | | |
|---|---|---|---|
| 6,271,412 B1 | 8/2001 | Chang et al. | 560/220 |
| 6,280,898 B1 | 8/2001 | Hasegawa et al. | 430/270.1 |
| 6,316,159 B1 | 11/2001 | Chang et al. | 430/270.1 |

FOREIGN PATENT DOCUMENTS

JP    2001-81139    *    3/2001

* cited by examiner

Primary Examiner—Helen L. Pezzuto
(74) Attorney, Agent, or Firm—Bacon & Thomas

(57) ABSTRACT

The present invention discloses a polymer having a repeated unit of the formula (II),

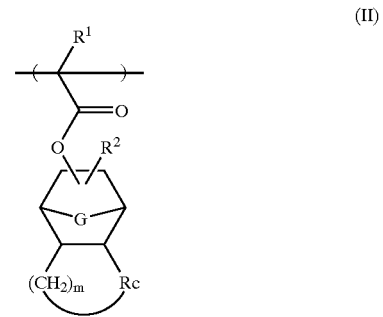

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)_n$, O or S, wherein n is 0, 1, 2, 3 or 4; Rc is a lactone group; and m is 1, 2 or 3. The polymer of the present invention can be used to form the chemical amplified photoresist composition, which can then be applied to general lithography processes, and particularly to the lithography of ArF, KrF or the like light source, and exhibit excellent resolution, figures and photosensitivity.

27 Claims, No Drawings

POLYMER FOR CHEMICAL AMPLIFIED PHOTORESIST COMPOSITIONS

BACKGROUND OF THE INVENTION

1. Field of the Invention

The present invention relates to a polymer, and particularly to a polymer that could be applied to certain semiconductor manufacturing processes.

2. Related Prior Art

Integral circuit layering is crucial in semiconductor industries such that the number of integral layers on an integral circuit must be maximized. Therefore, narrower wire widths for lithography are required. To achieve better resolution, light sources with shorter wavelengths or exposure systems with larger numerical apertures are applied.

Recently, a tetrapolymer iBMA-MMA-tBMA-MMA (poly isobornyl methacrylate-methyl methacrylate-t-butyl methacrylate-methacrylic acid) is reported to be a possible resin system for ArF resist:

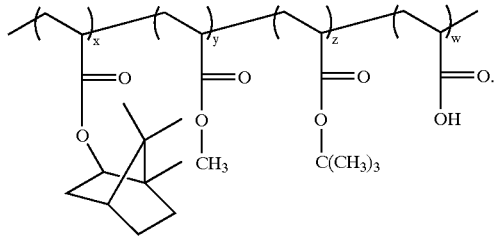

For such polymers, there are still some disadvantages, for example, low etch resistance and bad adhesion due to the four monomer composition. Therefore, a new resin for the compositions of resists is eager to be developed.

U.S. Pat. No. 6,271,412 and 6,280,898 and Japanese Patent Publication No. 2001-242627 have disclosed different polymers, which can form photoresist compositions and then be applied to semiconductor component manufacturing.

SUMMARY OF THE INVENTION

An object of the present invention is to provide a polymer having good thermal property as well as good hydrophilicity, adhesion and dry etch resistance. Furthermore, the polymer is characterized by penetrability of a 193 nm light source.

Accordingly, the polymer is comprised of formula (II) units,

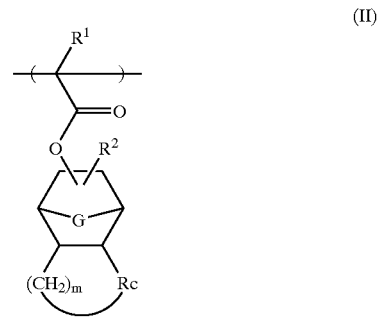

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)_n$, O or S, wherein n is 0, 1,2,3 or 4; Rc is a lactone group; and m is 1, 2 or 3.

The polymer of the present invention can further be combined with a photo-acid generator (PAG), an acid quencher, an additive, a solvent, etc. To form a chemical amplified photoresist composition which can be applied to general lithography Processes, and particularly to the 193 n light source processes, whereby excellent resolution, figures and photosensitivity can be achieved. Such processes are well known by those skilled in this art.

DETAILED DESCRIPTION OF THE INVENTION

The polymer of the present invention composes formula (II) units, where formula (II) units are essentially formed through a reaction involving a formula (I) compound,

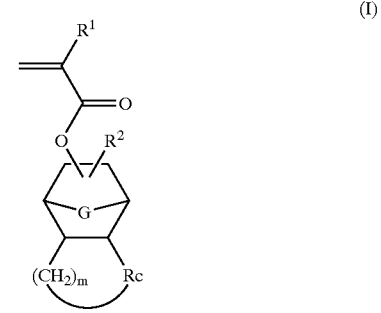

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)$n, O or S, wherein n is 0, 1 2, 3 or 4; Rc is a lactone group; and m is 1, 2 or 3.

This reaction can be performed by polymerization of the above compound or copolymerizing the above compound with other vinyl monomers in the existence of catalysts.

One of the methods for preparing the compound of formula (I) is shown as the following scheme,

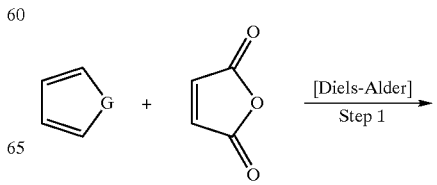

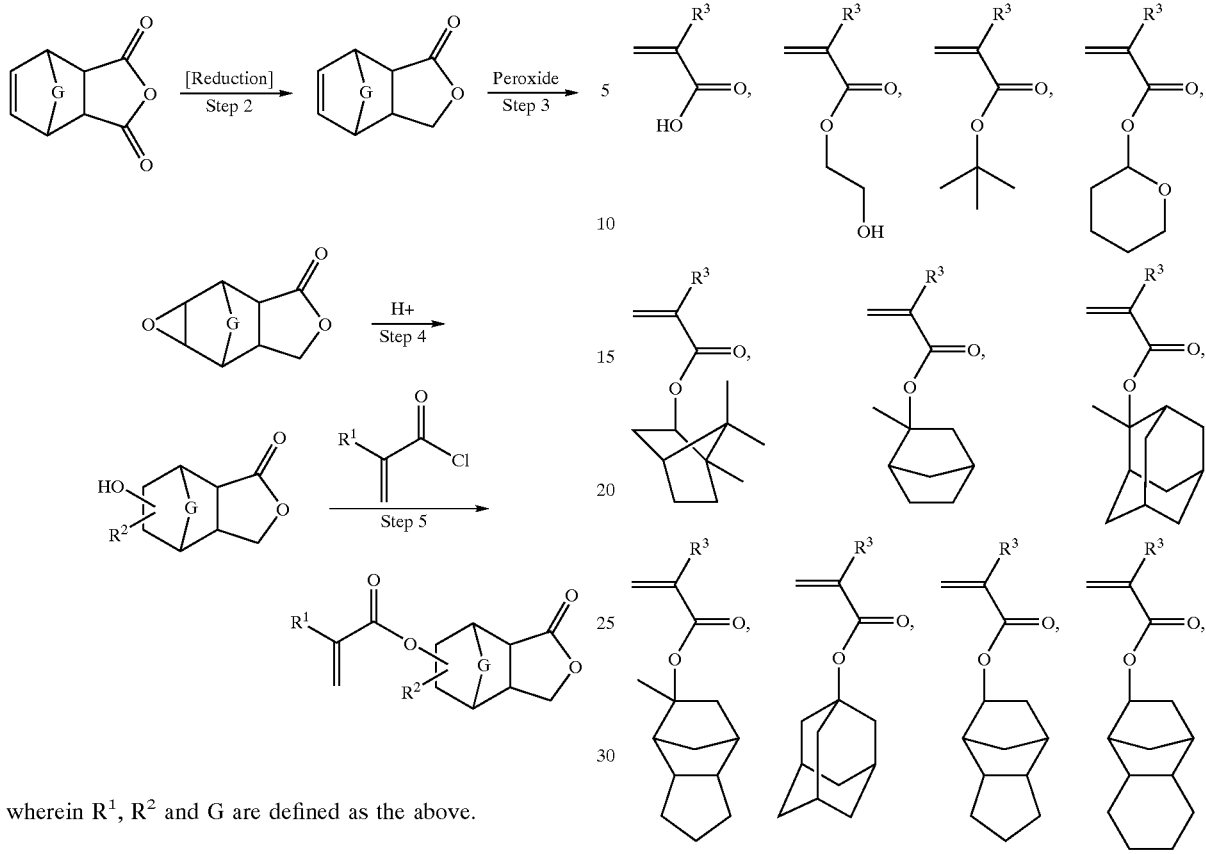

wherein $R^1$, $R^2$ and G are defined as the above.

In Step 1, a proper diene compound such as butadiene, cyclopentadiene, furan and thiophene, reacts with maleic anhydride to perform the Diels-Alder reaction. Then, the acid anhydride adducts are reduced under the well-known conditions in the Step 2. Preferably reaction is carried out using sodium boron hydride in dried polar solvent such as dimethylformamide or tetrahydrofuran. In Step 3, peroxide is provided to oxidize the double-bond compound into an epoxide. In Step 4, the epoxide reacts with a proper nucleophilic reagent such as water, alcohol and thiol, to perform a ring opening addition reaction under an acidic environment and then obtaining a hydroxyl derivative can be obtained. In Step 5, the hydroxyl derivative reacts with (alkyl)acryloyl chloride or acryloyl chloride to perform esterification resulting in and finally the compound of the formula (I) is obtained. Detailed procedures for preparing the compound of the present invention are described in the preferred embodiments.

The compounds of the formula (I) can be polymerized or copolymerized with other vinyl monomers to produce various polymers with or without the assistance of catalysts. Particularly, when being applied to the 193 nm processes, the vinyl monomers preferably have no aryl group to enable the light to pass therethrough. Below are some examples of vinyl monomers, wherein $R^3$ is H, haloalkyl group, or $C_1$–$C_4$ alkyl group.

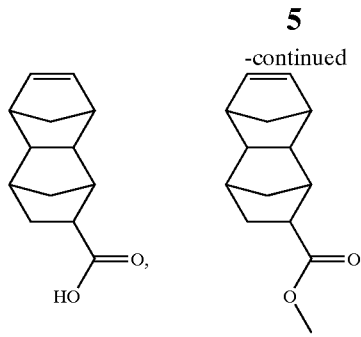

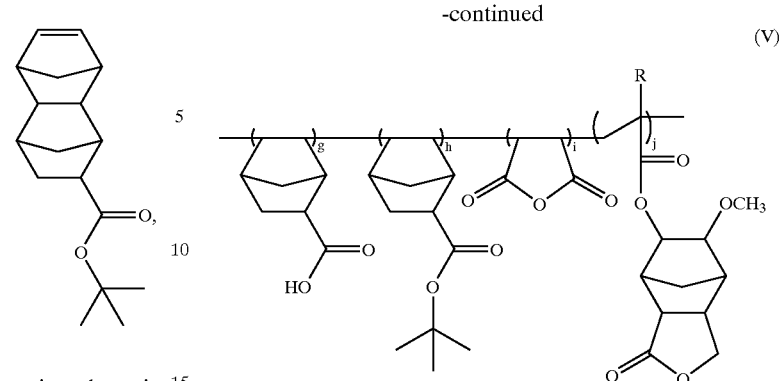

The polymer of the present invention comprises the unit of the formula (II),

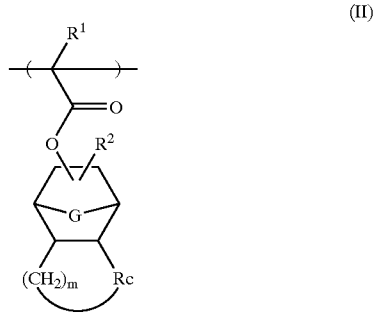

(II)

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)_n$, O or S, wherein n is 0, 1, 2, 3 or 4; Rc is a lactone group; and m is 1, 2 or 3.

The structure unit of the polymer or copolymers polymerized or copolymerized from compound (I) can be the following formula (III), formula (IV) or formula (V),

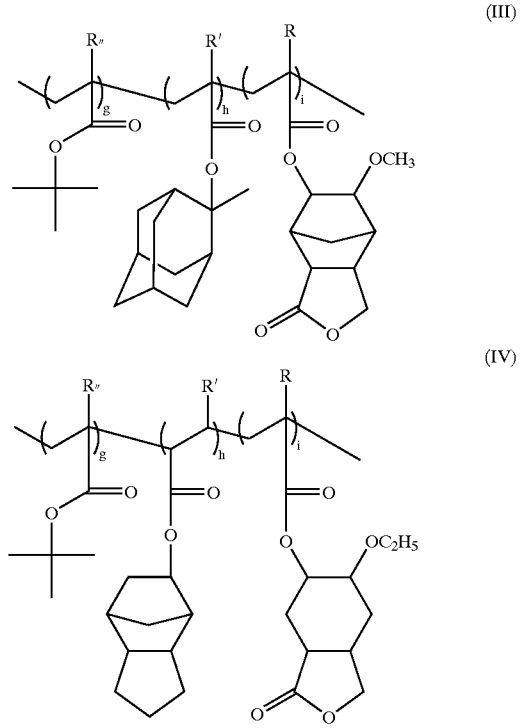

wherein R, R' and R" each independently is H, haloalkyl group or methyl group. In the structure unit of formula (III) and (IV) g+h+i=1, more preferably g/(g+h+i)=0.01–0.8, h/(g+h+i)=0.01–0.8, i/(g+h+i)=0.01–0.8; in the structure unit of formula (V) g+h+i+j=1, more preferably g/(g+h+i+j)=0.01–0.5, h/(g+h+i+j)=0.01–0.8, i/(g+h+i+j)=0.01–0.8, j/(g+h+i+j)=0.01–0.8.

The above polymers can be used individually, or by mixing with one or more thereof.

The polymer of the present invention is preferably soluble in organic solvents, and has a glass transfer temperature (Tg) ranging from 50 to 220° C., molecular weight ranging from 1,000 to 500,000, and degradation temperature (Td) larger than 80° C.

The method for polymerization is not restricted, and is preferably done by mixing the above monomers in the existence of catalysts. The catalysts can be those well known by one skilled in this art, and preferably 2,2'-azo-bis-isobutyronitrile (AIBN) or dimethyl-2,2'-azo-bis-isobutyrate radical initiator (V-601).

The chemical amplified photoresist compositions of the present invention can be used in the process of lithography. Especially, the chemical amplified photoresist compositions of the present invention can be used in the process of 193 nm (ArF excimer laser) lithography.

More detailed examples are used to illustrate the present invention, and these examples are used to explain the present invention. The examples below, which are given simply by way of illustration, must not be taken to limit the scope of the invention.

DESCRIPTION OF THE PREFERRED EMBODIMENTS

PREPARATION EXAMPLE 1

Synthesis of Monomer (I-1)

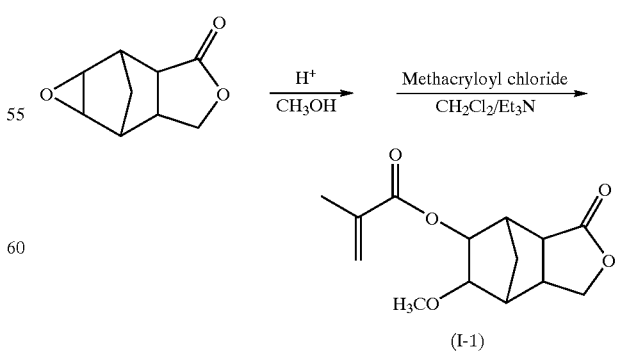

8,9-epoxy-3-oxo-4-oxa-tricyclo[5.2.1.0$^{2,6}$]decane (16.6 g) is dissolved in methanol (200 mL), and then reacts with concentrated sulfuric acid (0.25 mL) to perform a ring opening reaction. After the reaction is completed, the solution is neutralized and concentrated in vacuum. The residue was dissolved in 200 ml of methylene chloride and 10.2 g of triethylamine. To this mixture below 15° C., 10.5 g of methacryloyl chloride was added dropwise. After the completion of addition, the solution was agitated for 4 hours at room temperature, followed by conventional extraction and washing. The oily substance collected was purified by silica gel column chromatography, yielding 18.4 g of 9-methoxy-5-oxo-4-oxa-tricyclo[5.2.1.0$^{2,6}$]dec-8-yl methacrylate) (I-1) (18.4 g), and the yield is 69%. $^1$H-NMR (CDCl$_3$, 300 MHz); δ 5.89 (1H, brs), 5.37 (1H, brs), 4.81 (1H, m), 3.96 (1H, m), 3.67–3.57 (2H, m), 3.54 (3H, s), 2.79 (1H, m), 2.57 (1H, m), 2.55 (1H, m), 2.37 (1H, m), 1.77–1.74 (4H, m), 1.38 (1H, m). $^{13}$C-NMR (CDCl$_3$, 75 MHz). δ 171.4, 165.6, 136.0, 124.8, 84.9, 79.5, 70.0, 51.0, 46.1, 45.7, 40.4, 39.1, 32.4, 17.8.

PREPARATION EXAMPLE 2

Synthesis of Monomer (I-2)

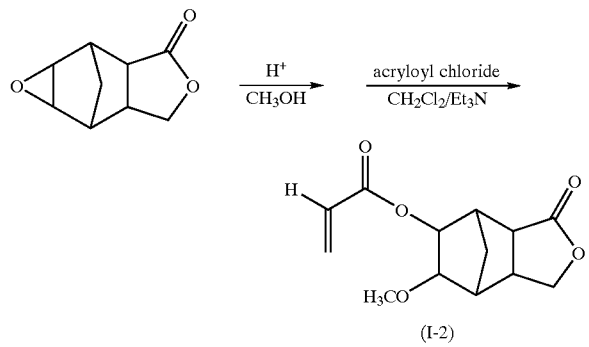

(I-2)

8,9-epoxy-3-oxo-4-oxa-tricyclo[5.2.1.0$^{2,6}$]decane (16.6 g) is dissolved in methanol (200 mL), and then reacts with concentrated sulfuric acid (0.25 mL) resulting to perform in a ring opening reaction. After the reaction is completed, the solution is neutralized and concentrated in vacuum. The residue was dissolved in 200 ml of methylene chloride and 10.2 g of triethylamine. To this mixture below 15° C., 10.5 g of methacryloyl chloride was added dropwise. After the completion of addition, the solution was agitated for 4 hours at room temperature, followed by conventional extraction and washing. The oily substance collected was purified by silica gel column chromatography, yielding 18.4 g of 9-methoxy-5-oxo-4-oxa-tricyclo[5.2.1.0$^{2,6}$]dec-8-yl acrylate) (I-1) (18.9 g), and the yield is 75%. $^1$H-NMR (CDCl$_3$, 300 MHz, J in Hz); δ 6.38 (1H, dd, J=17.4, 0.6), 6.11 (1H, dd, J=17.4, 10.5), 5.82 (1H, dd, J=10.5, 0.56), 5.01 (1H, brs), 4.17 (1H, d, J=5.0), 3.86 (1H, d, J=5.6), 3.79 (1H, dd, J=5.6, 2.7), 3.72 (3H, s), 2.95 (1H, m), 2.81 (1H, m), 2.73 (1H, m), 2.56 (1H, brs), 1.95 (1H, d, J=10.9), 1.57 (1H, d, J=10.9). $^{13}$C-NMR (CDCl$_3$, 75 MHz) δ 171.9, 165.0, 130.7, 128.6, 85.4, 80.0, 70.5, 51.6, 46.7, 46.2, 40.8, 39.6, 32.9.

PREPARATION EXAMPLE 3

Synthesis of Monomers (I-3)

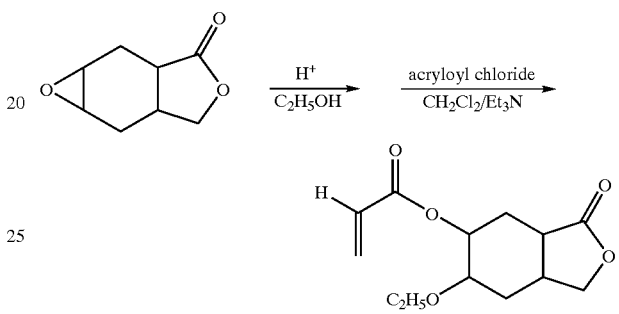

Repeat steps of Example 2, but replace the initial reactant 8,9-epoxy-3-oxo-4-oxa-tricyclo[5.2.1.0$^{2,6}$]decaneis with 3,4-epoxy-7-oxo-8-oxa-bicyclo[4.3.0]nonane, and replace methanol with anhydrous ethanol. The colorless oil product, 4-ethoxy-9-oxo-8-oxa-bicyclo[4.3.0]non-3-yl acrylate (I-3), is then obtained. $^1$H-NMR (CDCl$_3$, 300 MHz, J in Hz); δ 6.28 (1H, dd, J=17.4, 1.8), 5.99 (1H, dd, J=17.4, 10.6), 5.75 (1H, dd, J=10.6, 1.8), 4.91 (1H, brs), 4.11 (1H, m), 3.85 (1H, m), 3.58 (1H, m), 3.44 (1H, m), 3.22 (1H, m), 2.61–2.47 (2H, m), 2.25 (1H, m), 1.91–1.72 (2H, m), 1.09–0.97 (5H, m). $^{13}$C-NMR (CDCl$_3$, 75 MHz) δ 171.6, 164.7, 130.9, 128.0, 71.2, 70.8, 69.2, 63.8, 35.7, 30.3, 25.1, 20.7, 14.9.

PREPARATION EXAMPLES 4–7

Repeat steps of Preparation Example 1, but replace the initial reactants and solvents with those listed in Table A, in which the products are listed.

TABLE A

| | Initial Reactant | Solvent | Product |
|---|---|---|---|
| Preparation Example 4 | (structure) | 2-Propanol | (structure) I-4 |

TABLE A-continued

| | Initial Reactant | Solvent | Product |
|---|---|---|---|
| Preparation Example 5 | 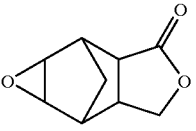 | Cyclohexanethiol | 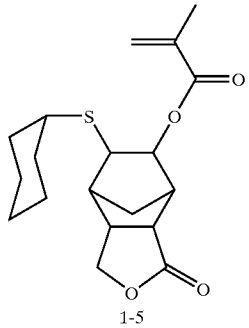<br>1-5 |
| Preparation Example 6 | 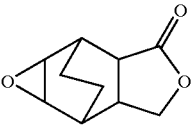 | H₂O, THF | 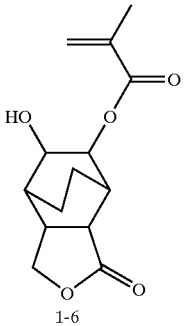<br>1-6 |
| Preparation Example 7 | 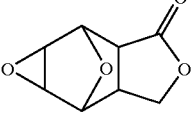 | Methanol | 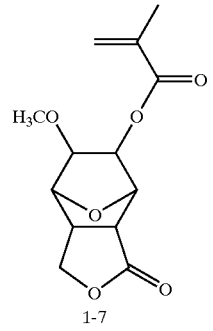<br>1-7 |

EXAMPLE 1

Synthesis of the Polymer of the Formula (II-1)

Tetrahydrofuran (20 mL), tert-butyl methacrylate (2.13 g), 2-methyl-2-adamantyl methacrylate (4.69 g) and 9-methoxy-5-oxo-4-oxa-tricyclo[5.2.1.0$^{2,6}$]dec-8-yl methacrylate (3.99 g) are mixed in a reactor, and then an initiator 2,2'-azo-bis-isobutyronitrile (AIBN) (1.1 g) is added therein to perform reaction at 65° C. After the reaction is completed, the solution to which tetrahydrofuran (20 mL) is added is transferred into a container containing hexane (1L) to generate white precipitate. The precipitate is then dried by filtration to obtain white powders (8.43 g), i.e., the polymer of the formula (II-1) with repeated units. The yield is 78%. Weight-average molecular weight of the polymer measured with GPC is 14,100, and glass transition temperature (Tg) is 169° C.

formula (II-1)

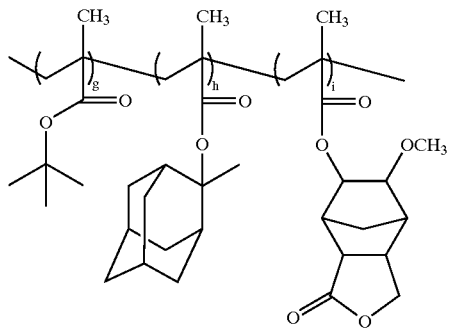

[g = 0.30, h = 0.40, i = 0.30, M$_w$ = 14100]

EXAMPLE 2

Synthesis of the Polymer of the formula (II-2)

Tetrahydrofuran (20 mL), tert-butyl methacrylate (2.13 g), 2-methyl-2-adamantyl methacrylate (4.69 g) and 4-ethoxy-9-oxo-8-oxa-bicyclo[4.3.0]non-3-yl methacrylate (4.02 g) are mixed in a reactor. Next, an initiator 2,2'-azo-bis-isobutyronitrile (AIBN) (1.1 g) is added to perform reaction at 70° C. overnight, and then tetrahydrofuran (20 mL) is added therein. Next, the solution is transferred into a container containing hexane (1L) to generate white precipitate. The precipitate is then dried by filtration to obtain white powders (6.83 g), i.e., the polymer of the formula (II-2) with repeated units. The yield is 63%. weight-average molecular weight of the polymer measured with GPC is 19,200, and glass transition temperature (Tg) is 121° C.

formula (II-2)

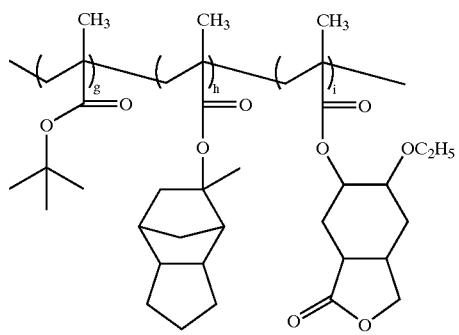

[g = 0.30, h = 0.40, i = 0.30, M_w = 19200]

EXAMPLES 3–27

Repeat procedures of Preparation Example 1, but different monomers are used for polymerization and white polymer powders, having the following formulae (I-3)-(II-27), can be obtained.

formula (II-3)

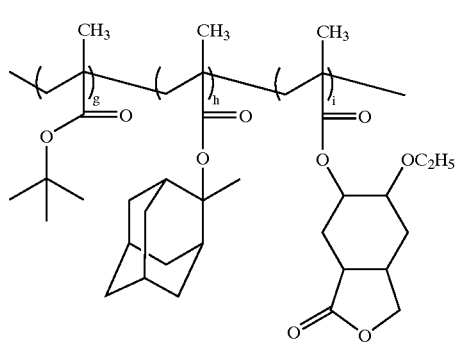

[g = 0.30, h = 0.40, i = 0.30, M_w = 16200]

formula (II-4)

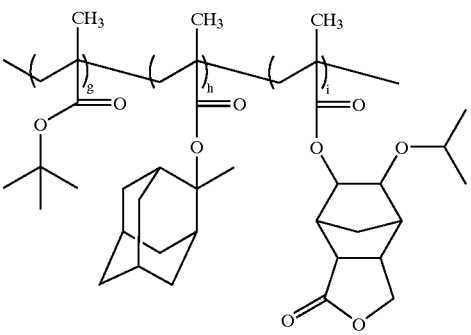

[g = 0.30, h = 0.40, i = 0.30, M_w = 18700]

formula (II-5)

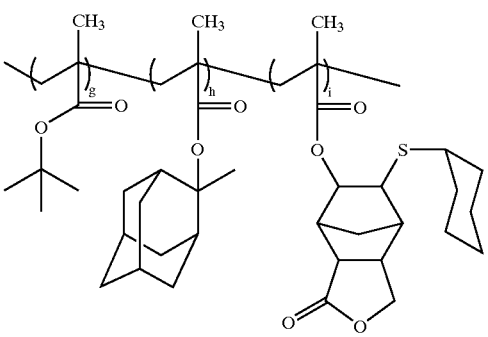

[g = 0.30, h = 0.40, i = 0.30, M_w = 17300]

formula (II-6)

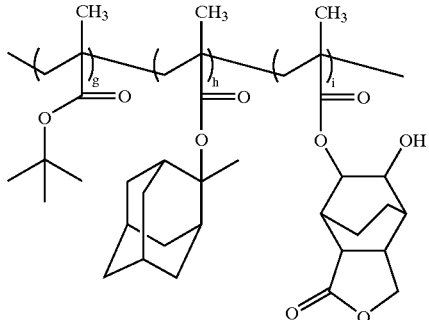

[g = 0.30, h = 0.40, i = 0.30, M_w = 15400]

formula (II-7)

[g = 0.30, h = 0.40, i = 0.30, M_w = 14600]

formula (II-8)
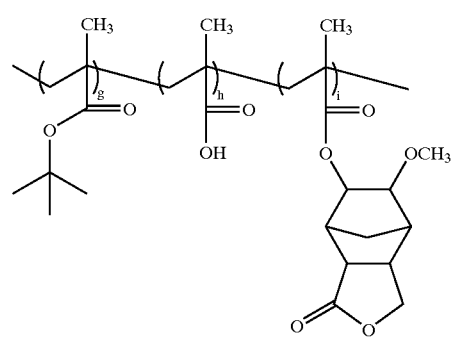
[g = 0.50, h = 0.10, i = 0.40, $M_w$ = 10200]
formula (II-9)
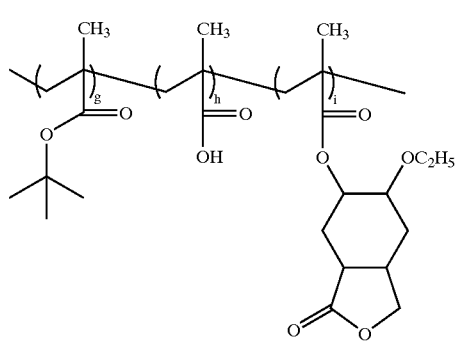
[g = 0.50, h = 0.10, i = 0.40, $M_w$ = 9700]
formula (II-10)
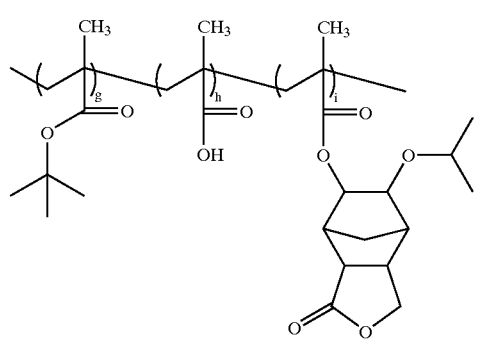
[g = 0.50, h = 0.10, i = 0.40, $M_w$ = 11600]
formula (II-11)
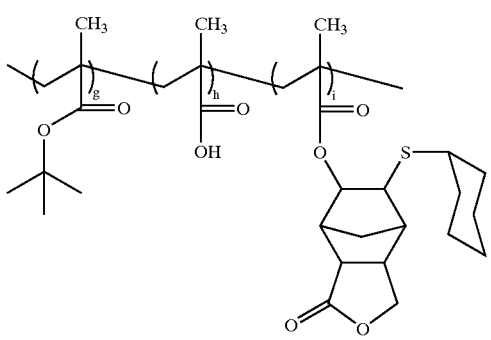
[g = 0.50, h = 0.10, i = 0.40, $M_w$ = 11500]
formula (II-12)
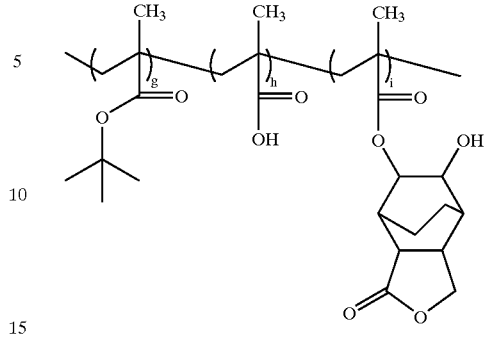
[g = 0.50, h = 0.10, i = 0.40, $M_w$ = 9300]
formula (II-13)
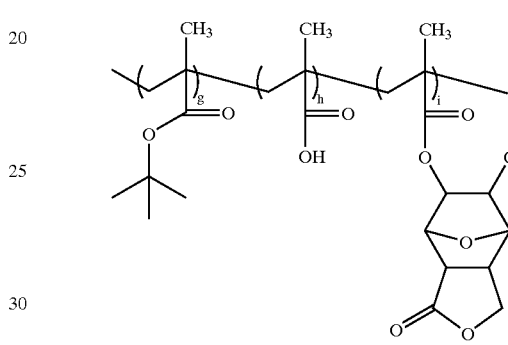
[g = 0.50, h = 0.10, i = 0.40, $M_w$ = 8700]
formula (II-14)
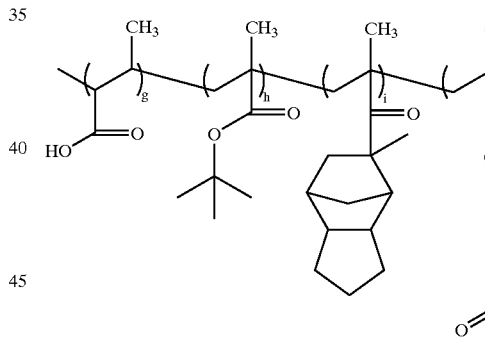
[g = 0.05, h = 0.30, i = 0.40, j = 0.25, $M_w$ = 10500]
formula (II-15)
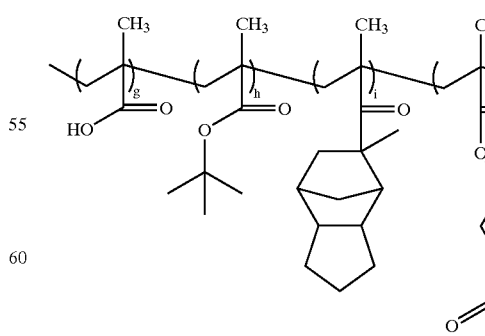
[g = 0.05, h = 0.30, i = 0.40, j = 0.25, $M_w$ = 13300]

formula (II-16)
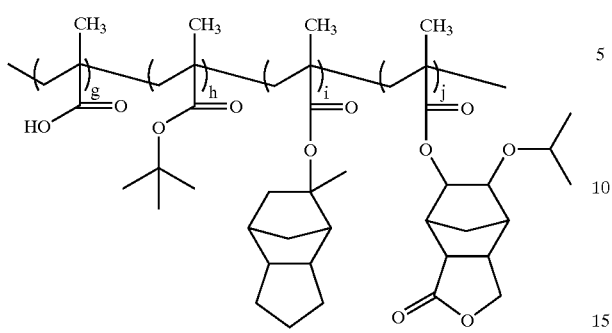
[g = 0.05, h = 0.30, i = 0.40, j = 0.25, $M_w$ = 12600]
formula (II-17)
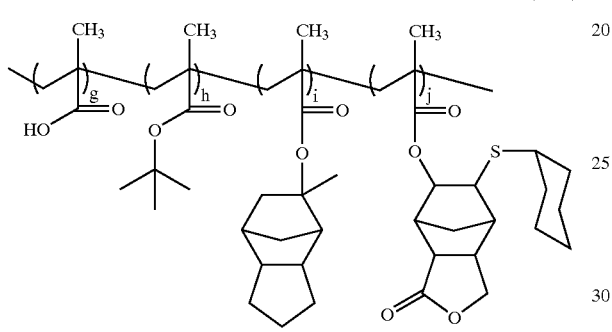
[g = 0.05, h = 0.30, i = 0.40, j = 0.25, $M_w$ = 9500]
formula (II-18)
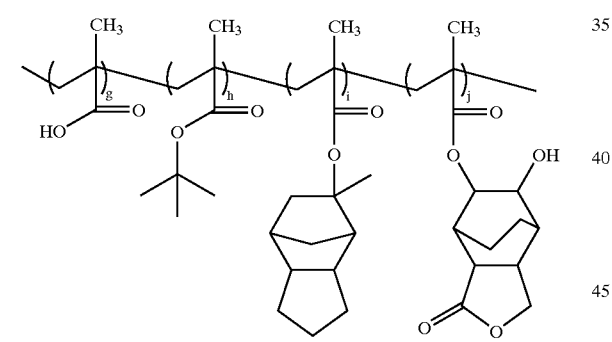
[g = 0.05, h = 0.30, i = 0.40, j = 0.25, $M_w$ = 11100]
formula (II-19)
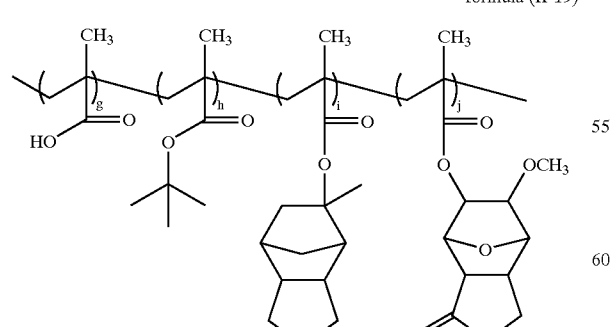
[g = 0.05, h = 0.30, i = 0.40, j = 0.25, $M_w$ = 11700]
formula (II-20)
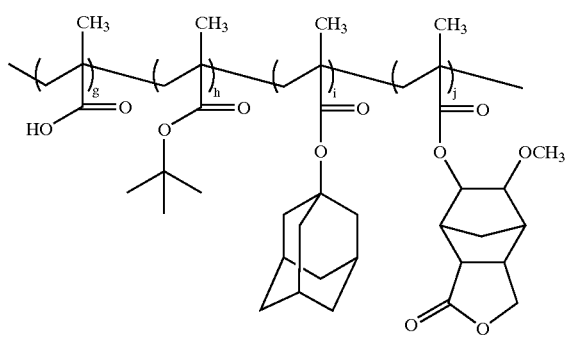
[g = 0.05, h = 0.40, i = 0.30, j = 0.25, $M_w$ = 10800]
formula (II-21)
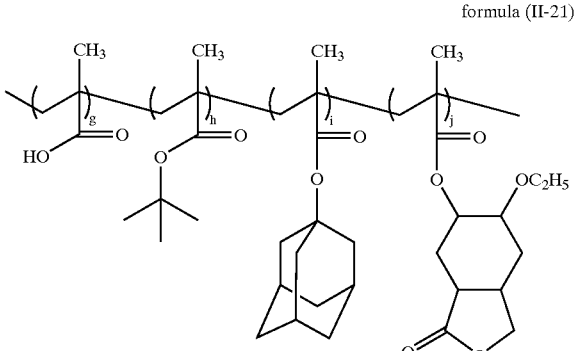
[g = 0.05, h = 0.40, i = 0.30, j = 0.25, $M_w$ = 9600]
formula (II-22)
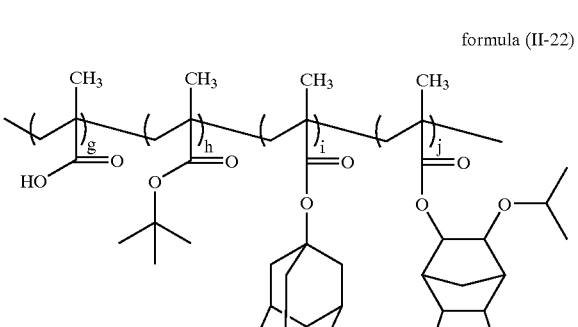
[g = 0.05, h = 0.40, i = 0.30, j = 0.25, $M_w$ = 9900]
formula (II-23)
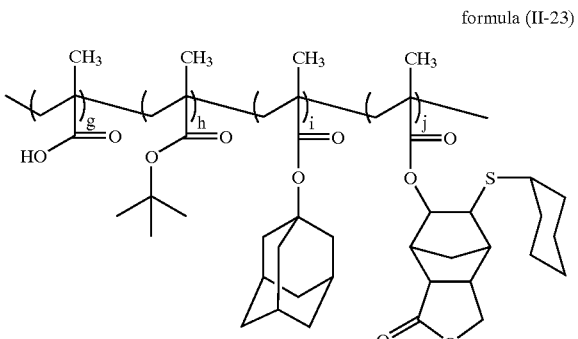
[g = 0.05, h = 0.40, i = 0.30, j = 0.25, $M_w$ = 10500]

formula (II-24)

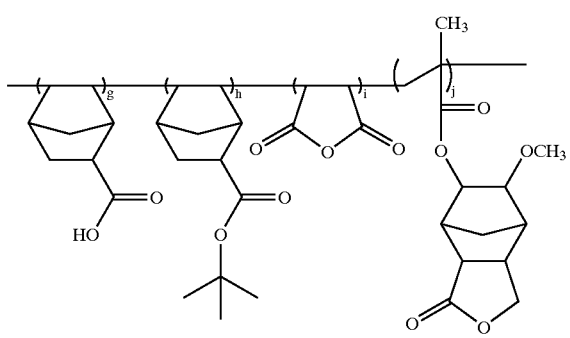

[g = 0.05, h = 0.40, i = 0.45, j = 0.10, $M_w$ = 13900]

formula (II-25)

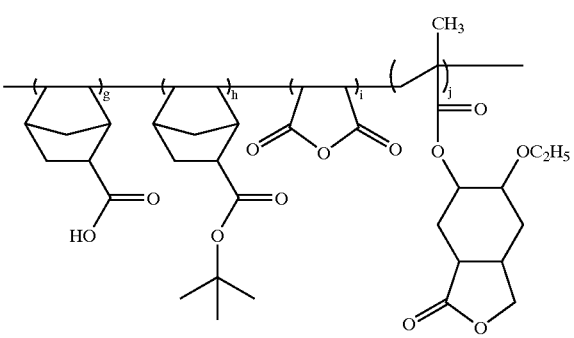

[g = 0.05, h = 0.40, i = 0.45, j = 0.10, $M_w$ = 12600]

formula (II-26)

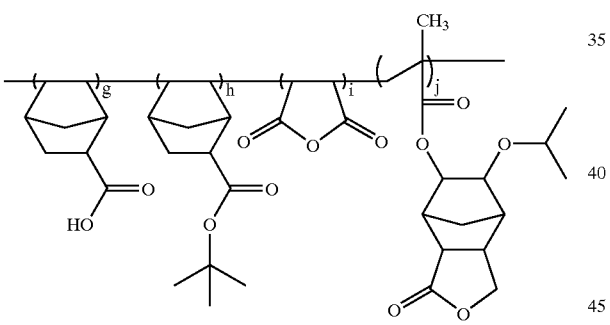

[g = 0.05, h = 0.40, i = 0.45, j = 0.10, $M_w$ = 13400]

formula (II-27)

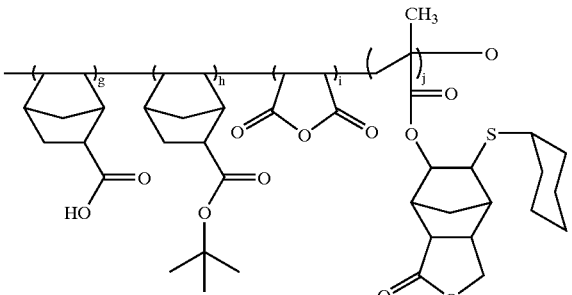

[g = 0.05, h = 0.40, i = 0.45, j = 0.10, $M_w$ = 11700]

Application Example: Preparing the Photoresist Composition

The polymer of the formula (II-1) (2 g) obtained from Example 1, triphenylsulfonium perfluoro-1-butanesulfonate (TPS-PFBS) (0.05 g), tert-butyl cholate (TBC) (0.06 g), propylene glycol monomethyl ether acetate (PGMEA) (10.4 g) and N-(hydroxy methyl)piperidine (0.5 mg) are mixed well and then filtered through a 0.45 μm filter. The filtrate is then spread on a piece of dry silicon by spinning to form a thin film.

The thin film is then dried at 130° C. for 90 seconds to obtain a 317.6 nm thick film. Next, the film is exposed under a deep ultraviolet (DUV) light source with 193 nm wavelength and 15–35 mj/cm², and then baked on a thermoplate at 130° C. for 90 seconds.

Next, the film is developed with tetramethyl ammonium hydroxide (TMAH) aqueous solution (2.38%), and then washed with deionized water, and spin-dried. The exposed area shows a structure of resolution of 0.15 μm under the observation of scanning electronic microscopy (SEM).

Accordingly, the polymer of the present invention can be used to form the chemical amplified photoresist compositions, which can be well applied to general lithography processes, and particularly to the ArF, KrF or the like process to obtain superior resolution, figures and photosensitivity.

From the foregoing description, one skilled in the art can easily ascertain the essential characteristics of this invention, and without departing from the scope thereof, can make various changes and modifications of the invention to adapt it to various usages and conditions. Thus, other embodiments are also within the claims.

What is claimed is:

1. A polymer comprising units of the formula (II) and having a weight average molecular weight of 1,000 to 500,000,

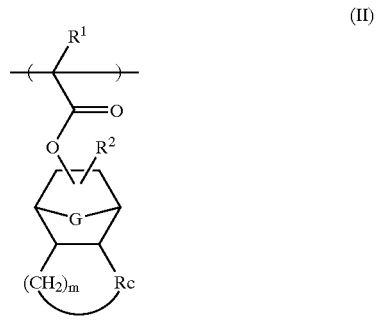

(II)

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)_n$, O or S, wherein n is 0, 1, 2, 3 or 4; Rc is a lactone group; and m is 1, 2 or 3.

2. The polymer of claim 1, wherein said $R^1$ is H or methyl group.

3. The polymer of claim 1, wherein said $R^2$ is hydroxyl group, $C_1$–$C_4$ alkoxy group, or thioalkyl group.

4. The polymer of claim 1, wherein said m is 1.

5. The polymer of claim 1, wherein said G is $(CH_2)_n$, n is 0, 1 or 2.

6. The polymer of claim 1, wherein said G is O or S.

7. The polymer of claim 1, wherein said polymer has the following formula (II-1), (II-2), (II-3), (II-4), (II-5), (II-6), or (II-7):

formula (II-1)
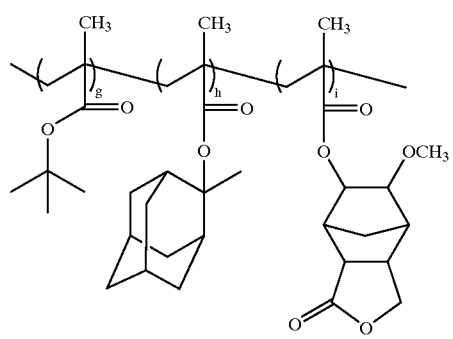
formula (II-2)
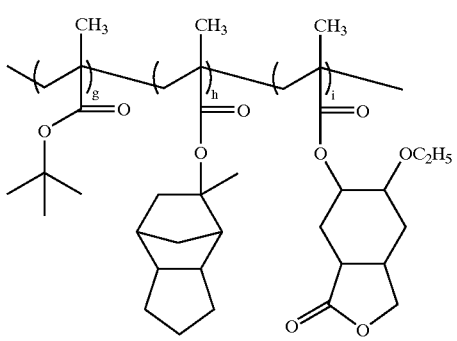
formula (II-3)
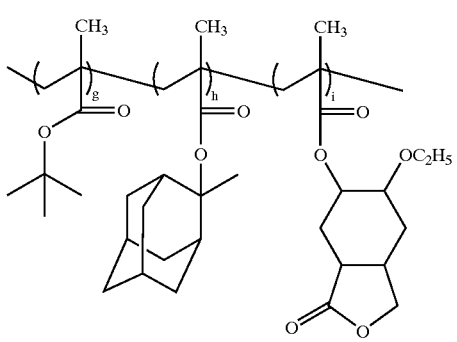
formula (II-4)
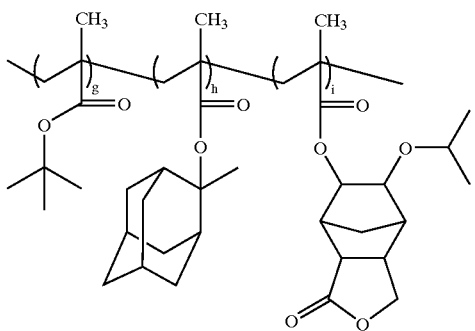
formula (II-5)
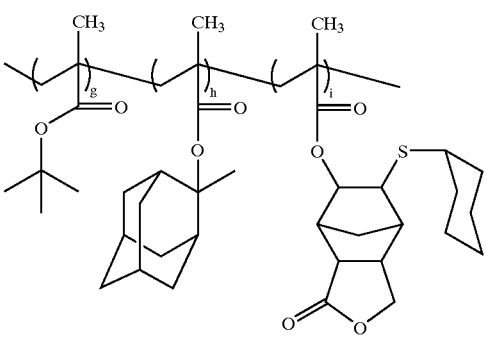
formula (II-6)
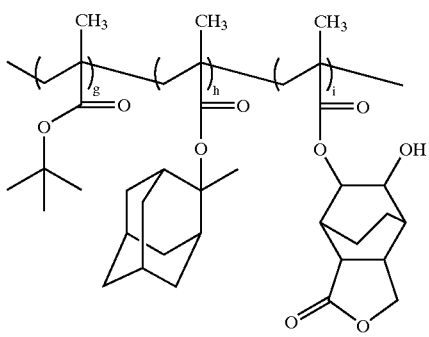
formula (II-7)
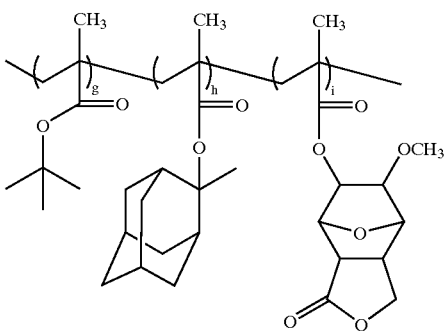
wherein g+h+i=1.
8. The polymer of claim 1, wherein g/(g+h+i) ranges from 0.01 to 0.8, h/(g+h+i) ranges from 0.01 to 0.8, and i/(g+h+i) ranges from 0.01 to 0.8.
9. The polymer of claim 1, wherein said polymer has the following formula (II-8), (II-9), (II-10), (II-11), (II-12), or (II-13):
formula (II-8)
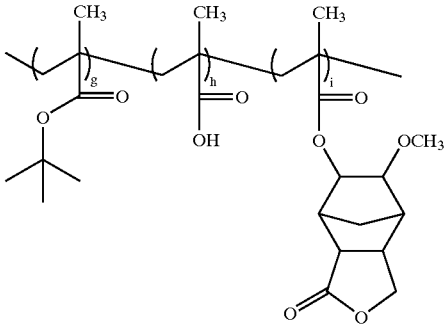

formula (II-9)
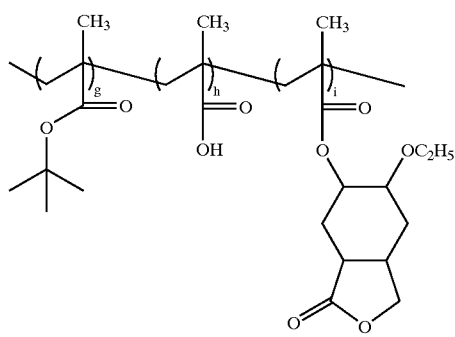
formula (II-10)
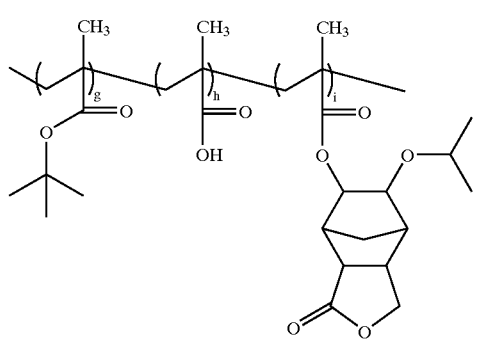
formula (II-11)
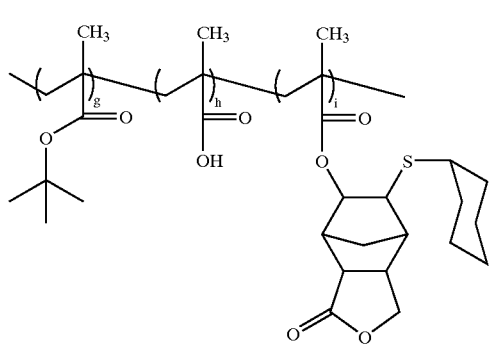
formula (II-12)
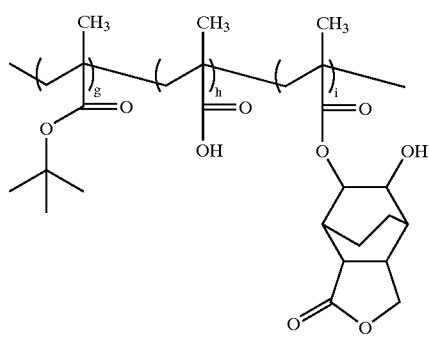
formula (II-13)
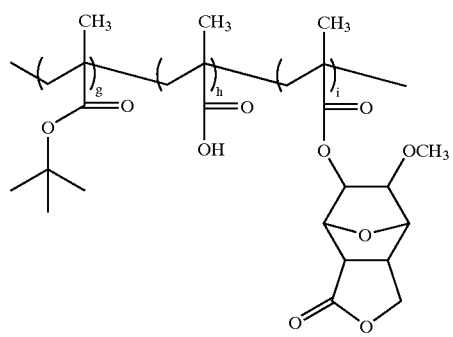
wherein g+h+i=1.
10. The polymer of claim 9, wherein g/(g+h+i) ranges from 0.01 to 0.8, h/(g+h+i) ranges from 0.01 to 0.5, and i/(g+h+i) ranges from 0.01 to 0.8.
11. The polymer of claim 1, wherein said polymer has the following formula (II-14), (II-15), (II-16), (II-17), (II-18), or (II-19):
formula (II-14)
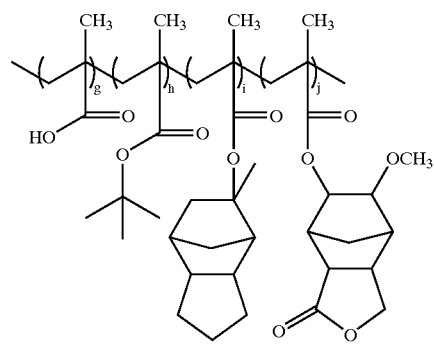
formula (II-15)
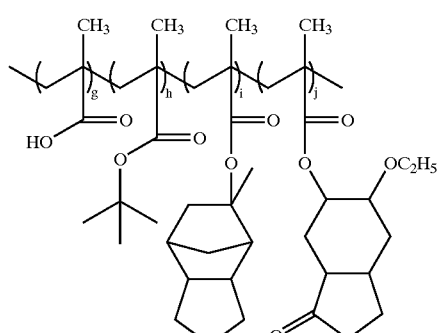

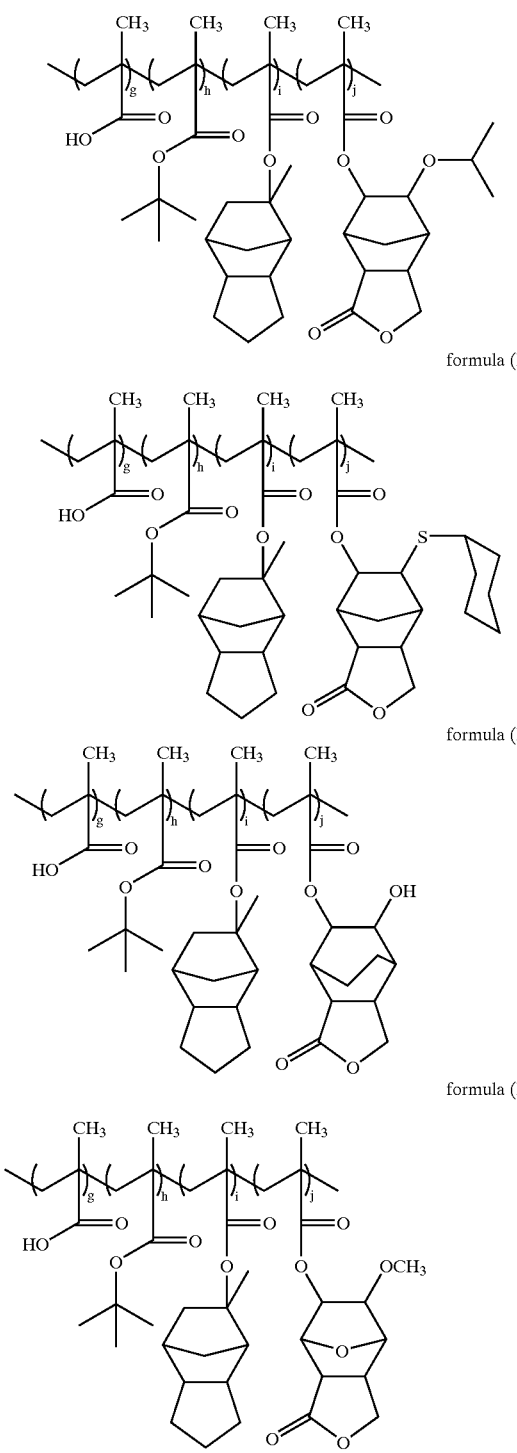
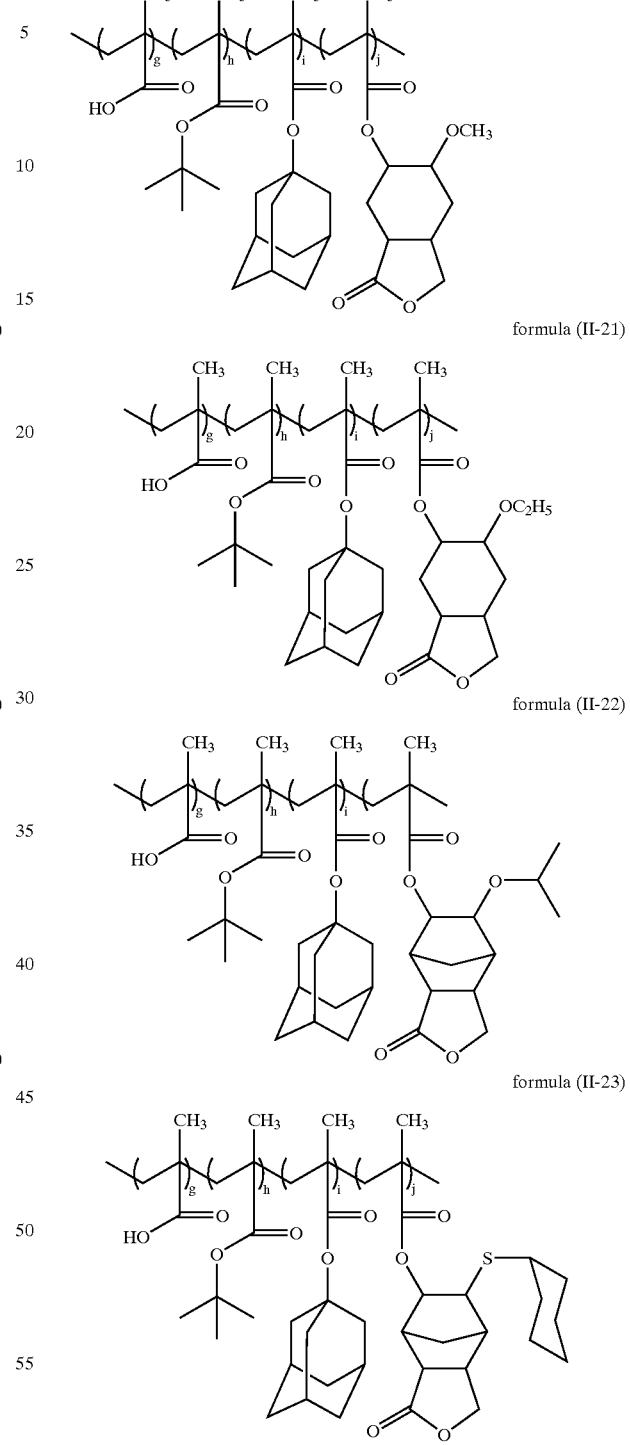

wherein g+h+i+j=1.

12. The polymer of claim 11, wherein g/(g+h+i+j) ranges from 0.01 to 0.5, h/(g+h+i+j) ranges from 0.01 to 0.8, i/(g+h+i+j) ranges from 0.01 to 0.8, and j/(g+h+i+j) ranges from 0.01 to 0.8.

13. The polymer of claim 1, wherein said polymer has the following formula (II-20), (II-21), (II-22), or (II-23):

wherein g+h+i+j=1.

14. The polymer of claim 13, wherein g/(g+h+i+j) ranges from 0.01 to 0.5, h/(g+h+i+j) ranges from 0.01 to 0.8, i/(g+h+i+j) ranges from 0.01 to 0.8, and j/(g+h+i+j) ranges from 0.01 to 0.8.

15. The polymer of claim 1, wherein said polymer has the following formula (II-24), (II-25), (II-26), or (II-27):

formula (II-24)

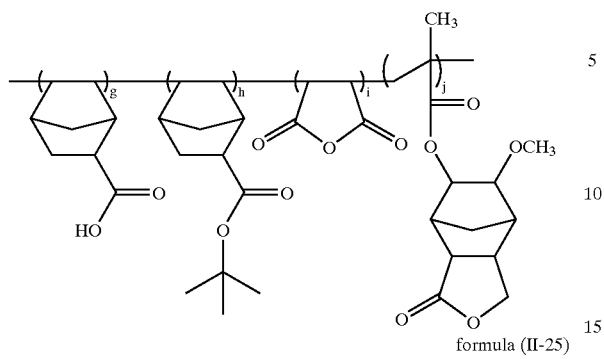

formula (II-25)

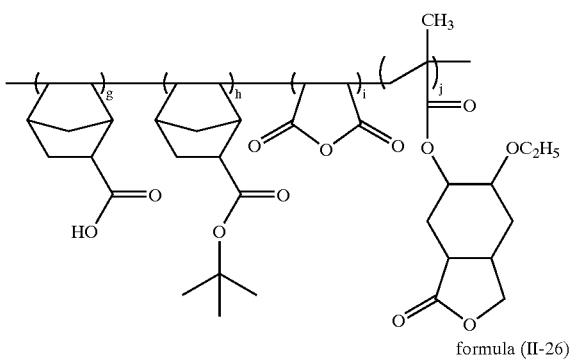

formula (II-26)

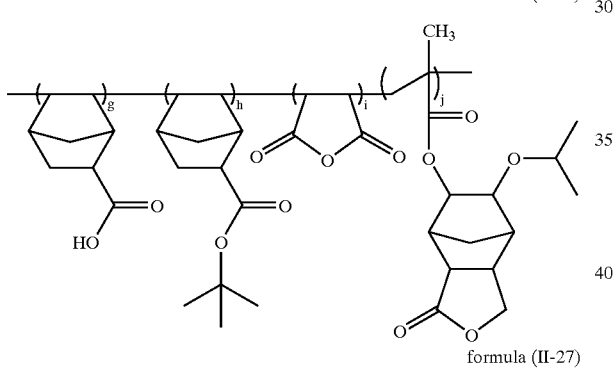

formula (II-27)

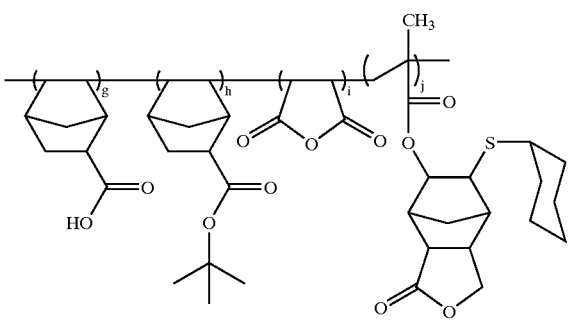

wherein g+h+i+j=1.

16. The polymer of claim 15, wherein g/(g+h+i+j) ranges from 0.01 to 0.5, h/(g+h+i+j) ranges from 0.01 to 0.8, i/(g+h+i+j) ranges from 0.01 to 0.8, and j/(g+h+i+j) ranges from 0.01 to 0.8.

17. The polymer of claim 1, wherein said polymer is soluble in organic solvents, and has a glass transfer temperature ranging from 50 to 220° C., molecular weight ranging from 1,000 to 500,000, and degradation temperature larger than 80° C.

18. A polymer, which is prepared by polymerizing or copolymerizing the following formula (I),

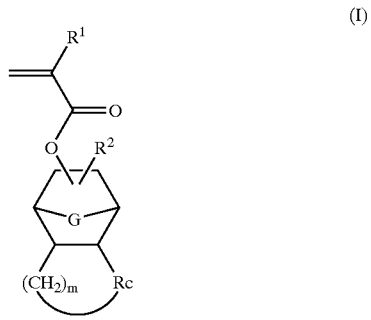

(I)

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)_n$, O or S, wherein n is 0, 1, 2, 3 or 4; Rc is a lactone group; and m is 1, 2 or 3.

19. The polymer of claim 18, wherein said $R^1$ is H or methyl group.

20. The polymer of claim 18, wherein said $R^2$ is hydroxyl group, $C_1$–$C_4$ alkoxy group, or thioalkyl group.

21. The polymer of claim 18, wherein said m is 1.

22. The polymer of claim 18, wherein said G is $(CH_2)_n$, n is 0, 1 or 2.

23. The polymer of claim 18, wherein said G is O or S.

24. The polymer of claim 18, wherein said vinyl monomers are selected from the group consisting of,

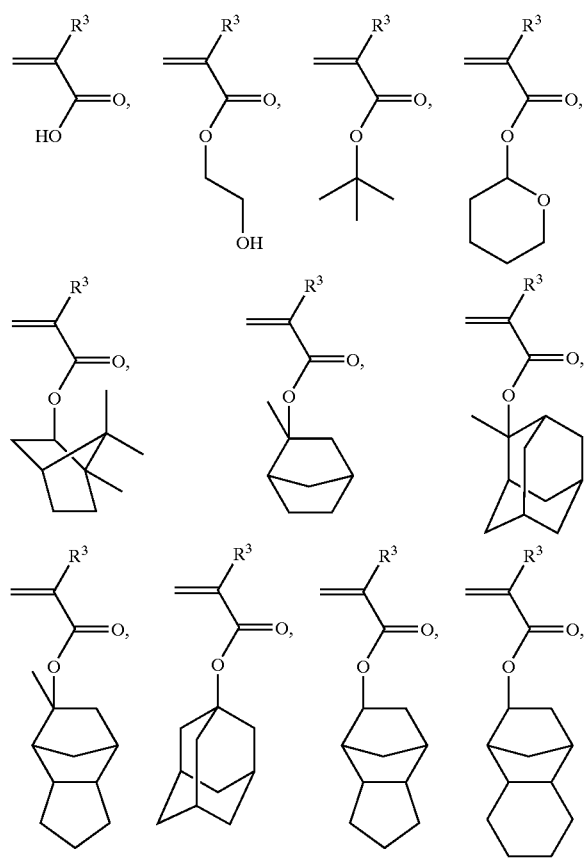

-continued

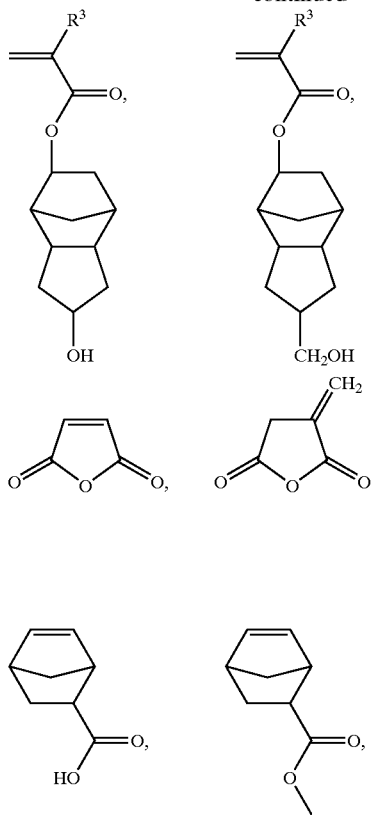

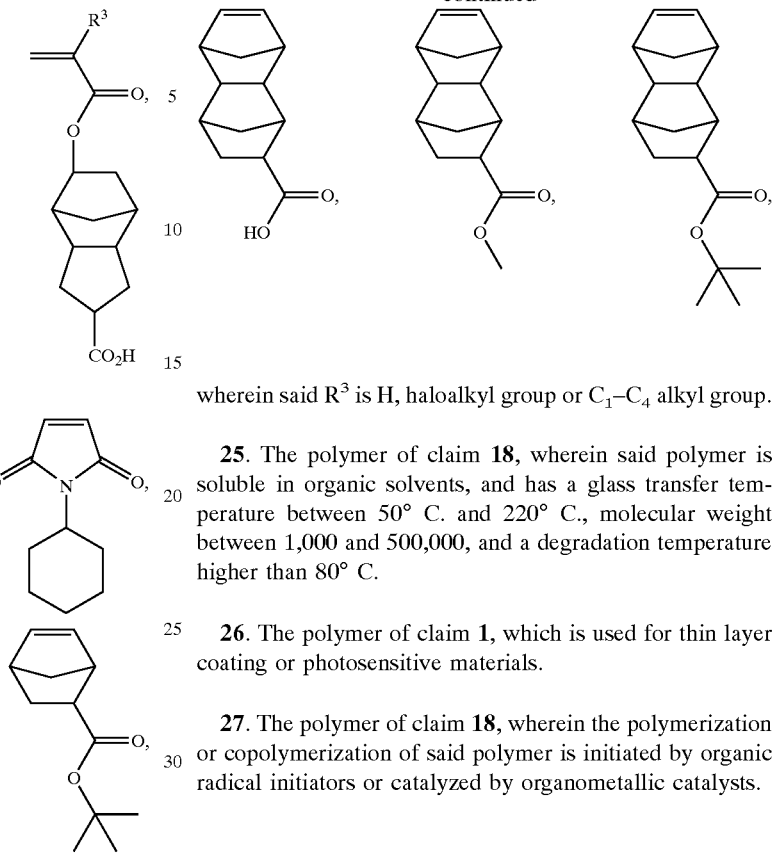

wherein said $R^3$ is H, haloalkyl group or $C_1$–$C_4$ alkyl group.

25. The polymer of claim 18, wherein said polymer is soluble in organic solvents, and has a glass transfer temperature between 50° C. and 220° C., molecular weight between 1,000 and 500,000, and a degradation temperature higher than 80° C.

26. The polymer of claim 1, which is used for thin layer coating or photosensitive materials.

27. The polymer of claim 18, wherein the polymerization or copolymerization of said polymer is initiated by organic radical initiators or catalyzed by organometallic catalysts.

* * * * *